(12) United States Patent
Mushiga et al.

(10) Patent No.: US 6,798,238 B2
(45) Date of Patent: Sep. 28, 2004

(54) SEMICONDUCTOR INTEGRATED CIRCUIT

(75) Inventors: Munehito Mushiga, Kanagawa (JP); Katsuhiro Seta, Tokyo (JP); Takeshi Yoshimoto, Kanagawa (JP); Toshiyuki Furusawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 10/372,937

(22) Filed: Feb. 26, 2003

(65) Prior Publication Data
US 2003/0160634 A1 Aug. 28, 2003

(30) Foreign Application Priority Data
Feb. 26, 2002 (JP) ........................................ 2002-049125

(51) Int. Cl.$^7$ ................................................ H03L 7/06
(52) U.S. Cl. ............................. 326/37; 326/38; 326/82; 327/141; 327/145
(58) Field of Search ............................. 326/37, 38, 82; 327/141, 145

(56) References Cited

U.S. PATENT DOCUMENTS 6,696,854 B2 * 2/2004 Momtaz et al. ................ 326/37
6,700,403 B1 * 3/2004 Dillon ............................ 326/37
6,710,619 B2 * 3/2004 Rzittka .......................... 326/37
6,710,620 B2 * 3/2004 Libov et al. ................... 326/37
6,717,434 B2 * 4/2004 Takahashi et al. ............. 326/37
6,744,277 B1 * 6/2004 Chang et al. .................. 326/37

FOREIGN PATENT DOCUMENTS

JP        6-203558        7/1994

* cited by examiner

Primary Examiner—Michael Tokar
Assistant Examiner—Lam T. Mai
(74) Attorney, Agent, or Firm—Oblon, Spivak, McClelland, Maier & Neustadt, P.C.

(57) ABSTRACT

A semiconductor integrated circuit, comprises a first reference voltage line; a second reference voltage line; a plurality of single logic circuits each including a plurality of transistors; a first switch having a first transistor provided between said first reference voltage line and said logic circuits, said first transistor having a higher threshold voltage than that of transistors in the logic circuits; and a second switch having a second transistor provided a between said second transistor having a higher threshold voltage than that of transistors in the logic circuits, said first and second switches being turned on when at least one of said single logic circuits is in operation, while said first and second switches being turned off when all of said single logic circuits are in standby state.

14 Claims, 9 Drawing Sheets

US 6,798,238 B2

SEMICONDUCTOR INTEGRATED CIRCUIT

CROSS REFERENCE TO RELATED APPLICATION

This application is based upon and claims the benefit of priority from the prior Japanese application No. 2002-49125, filed on Feb. 26, 2002; the entire contents of which are incorporated herein by reference.

BACKGROUND OF THE INVENTION

The present invention relates to a semiconductor integrated circuit comprised of a plurality of transistors in combination, and more particularly, it relates to an improved technology for reduced power consumption and accelerated signal transmission rate.

To attain acceleration of a reduced power consumption complementary metal oxide semiconductor (CMOS) logic circuit, it is required that the circuit is comprised of low threshold voltage transistors. However, there arises a problem that as a threshold voltage in the transistors is reduced, leak current during standby state is increased.

An improved multiple threshold voltage CMOS circuit (MT-CMOS circuit) has been proposed which effectively avoids this problem and is capable of attaining accelerated circuit operation and reduced leak current during standby state simultaneously.

FIG. 10 is a circuit diagram showing the prior art MT-CMOS circuit. The circuit in FIG. 10 is comprised of a virtual power supply line VDD1 connected to a power supply line VDD with an intervening high threshold voltage transistor Q1, and a virtual ground line VSS1 connected to a ground line VSS with an intervening low threshold voltage transistor Q2.

A low-Vth block 100, which has low threshold voltage transistors, is connected between the virtual power supply line VDD1 and the virtual ground line VSS1.

The low-Vth block 100 functions as an OR circuit, for example, and includes two P channel MOS transistors Q3 and Q4 which receive input signals IN1 and IN2 from respective gate electrodes thereof, and are connected in parallel between the virtual power supply line VDD1 and a node N, and two N channel MOS transistors Q5 and Q6 which similarly receive input signals IN1 and IN2 from respective gate electrodes thereof and are connected in series between the virtual power supply line VSS1 and the node N. Also, connected to the node N is an inverter comprised of a P channel transistor Q7 and an N channel transistor Q8 connected in series and having their respective gates connected to the node N in common.

Operation of the circuit will be detailed below.

During an operation (when the circuit is activated), both the transistors Q1 and Q2 are turned on to supply the low-Vth block 100 with supply voltage. The low-Vth block 100 operates at high speed since it is comprised of low threshold voltage transistors.

On the contrary, during a standby state, both the transistors Q1 and Q2 are turned off to break a leak path from the power supply line VDD to the ground line VSS, and hence, leak current is reduced.

In such a method, however, amounts of current supplied during the operation from the power supply line VDD to the virtual power supply line VDD1 and from the virtual ground line VSS1 to the ground line VSS depend upon a resistance (ON-resistance) at the activated high threshold voltage transistors Q1 and Q2. Thus, the ON-resistance should be reduced to attain an acceleration of the operation. For that purpose, it is required to enlarge gate widths of the high threshold voltage transistors Q1 and Q2, and this leads to an adverse effect of an increase in a chip area.

SUMMARY OF THE INVENTION

According to an embodiment of the present invention, there is provided a semiconductor integrated circuit, comprising:
 a first reference voltage line;
 a second reference voltage line;
 a plurality of single logic circuits each including a plurality of transistors;
 a first switch having a first transistor provided between said first reference voltage line and said logic circuits, said first transistor having a higher threshold voltage than that of transistors in the logic circuits; and
 a second switch having a second transistor provided a between said second transistor having a higher threshold voltage than that of transistors in the logic circuits,
 said first and second switches being turned on when at least one of said single logic circuits is in operation, while said first and second switches being turned off when all of said single logic circuits are in standby state.

According to further embodiment of the present invention, there is provided a semiconductor integrated circuit, comprising:
 a first reference voltage line;
 a second reference voltage line;
 a plurality of single logic circuits each comprised of combined transistors having first and second virtual power supply lines;
 a first shared switch interposed between said first reference voltage line and said first virtual power supply line for the single logic circuits, the first shared switch being a transistor having higher threshold voltage than that of the transistors of said single logic circuits; and
 a second shared switch interposed between the second reference voltage line and the second virtual power supply line for the single logic circuits, the second shared switch being a transistor having higher threshold voltage than that of the transistors of said single logic circuits;
 said first and second shared switches being turned on when at least one of said single logic circuits is in operation, while said first and second shared switches being turned off when all of said single logic circuits are in standby state.

According to still further embodiment of the present invention, there is provided a semiconductor integrated circuit, comprising:
 a first reference voltage line;
 a second reference voltage line;
 a plurality of single logic circuits each comprised of transistors having first and second virtual power supply lines;
 a first shared switch interposed between the first reference voltage line and the first virtual power supply line for the single logic circuits, the first shared switch being a transistor higher in threshold voltage than the transistors of the single logic circuits; and
 a second shared switch interposed between the second reference voltage line and the second virtual power supply line for the single logic circuits, the second shared switch being a transistor higher in threshold voltage than the transistors of the single logic circuits, said at least one of the single logic circuits is in a transition state, no transition of the output voltage being developed in the remaining single logic circuits.

According to further embodiment of the present invention, there is provided a semiconductor integrated circuit, comprising:

a first reference voltage line;

a second reference voltage line;

a plurality of single logic circuits each comprised of transistors in combination having first and second virtual power supply lines, the single logic circuits being segmented into three or more groups;

a first shared switch interposed between the first reference voltage line and the first virtual power supply line for the single logic circuits in odd-numbered segments, the first shared switch being a transistor higher in threshold voltage than the transistors of the single logic circuits; and a second shared switch interposed between the second reference voltage line and the second virtual power supply line for the single logic circuits in the odd-numbered segments, the second shared switch being a transistor higher in threshold voltage than the transistors of the single logic circuits, the single logic circuits in even numbered segments being capable of delaying transition of output voltage so that output voltages from the single logic circuits in the odd numbered segments would not simultaneously be in a sate of transition.

DETAILED DESCRIPTION OF THE INVENTION

Embodiments of semiconductor integrated circuits according to the present invention will be described with reference to the attached drawings.

In embodiments disclosed below, a semiconductor integrated circuit is designed in a configuration where most of its gate circuits consist of high threshold voltage transistors while only part of them consist of high and low threshold voltage transistors in combination, which is called "selective multiple threshold voltage complementary metal oxide semiconductor (SMT-CMOS) circuit", and this SMT-CMOS is advantageous in an acceleration of signal transmission and a reduction of power consumption. Hereinafter, gate circuitry configured of high threshold voltage transistors (serving as switches) and low threshold voltage transistors in combination is termed "MT gate cell".

First Embodiment

A first embodiment of the present invention will be described with reference to FIGS. 1 to 5. A circuit in FIG. 1 includes gate circuitry 1 in a design where part of the circuitry on a critical path are comprised of relatively low threshold voltage transistors and relatively high threshold voltage transistors (switches) in combination to serve as gate cells or MT gate cells, and the remaining part of the gate circuitry is comprised of relatively high threshold voltage transistors.

Figure 1:
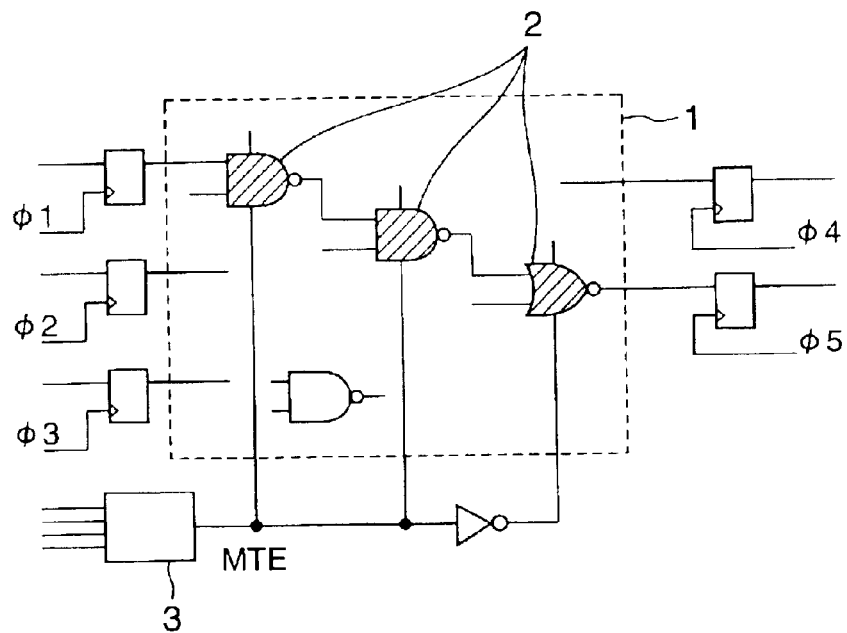
FIG. 1 is a circuit diagram showing a first embodiment of a semiconductor integrated circuit according to the present invention.

Referring to FIG. 1, MT gate cells 2 on the critical path are hatched. Each of the hatched MT gate cells 2 is under control of a control circuit 3 that uses the relatively high threshold voltage transistors (serving as switches) to switch between supply and break of supply voltage to gate cells (serving as single logic circuits) of the relatively low threshold transistors. The control circuit 3 control ON-OFF state of the power supply transistors within the MT gate cells.

As shown in FIG. 1, since the gate cells on the critical path are replaced with the MT gate cells 2 within the gate circuitry 1, signal transmission on the critical path can be accelerated. The remaining part of the circuitry is comprised of high threshold voltage transistors, and this brings about a precise control of leak current during operation.

Figure 2:
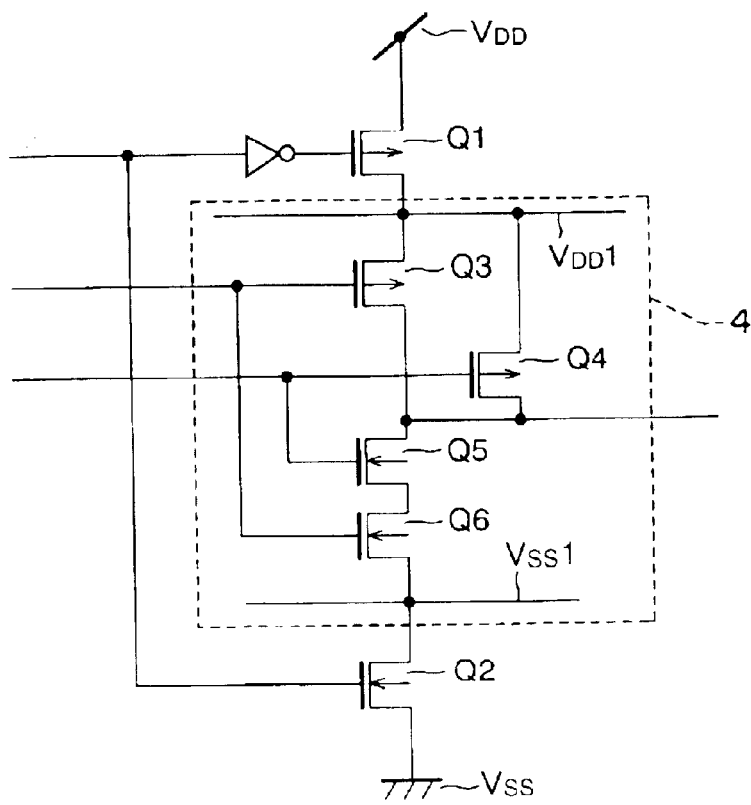
FIG. 2 depicts an exemplary MT gate cell for gate circuitry in FIG. 1.

An example of the MT gate cells 2 for the gate circuitry 1 is shown in FIG. 2. The circuitry in FIG. 2 includes a NAND circuit 4 having low threshold voltage transistors Q3 to Q6 connected between a virtual power supply line VDD1 and a virtual ground line VSS1, and transistors Q1 and Q2 functioning to switch between supply and break of supply voltage to the NAND circuit 4. The transistor Q1 is interposed between a power supply line VDD and the virtual power supply line VDD1 while the transistor Q2 is interposed between a ground line VSS and the virtual ground line VSS1, and both of the transistors are high threshold voltage transistors serving as switches, respectively.

In the circuitry in FIG. 2, as the transistors Q1 and Q2 are turned on, supply voltage is applied to the NAND circuit 4, and the circuit operates at high speed because it operates with low threshold voltage. On the contrary, as the transistors Q1 and Q2 are turned off, the leak path of the NAND circuit 4 will be broken so as to reduce leak current. The MT gate cell configuration can be applied to any single logic circuit as well as the NAND circuit as described in conjunction with FIG. 2.

Figure 3:
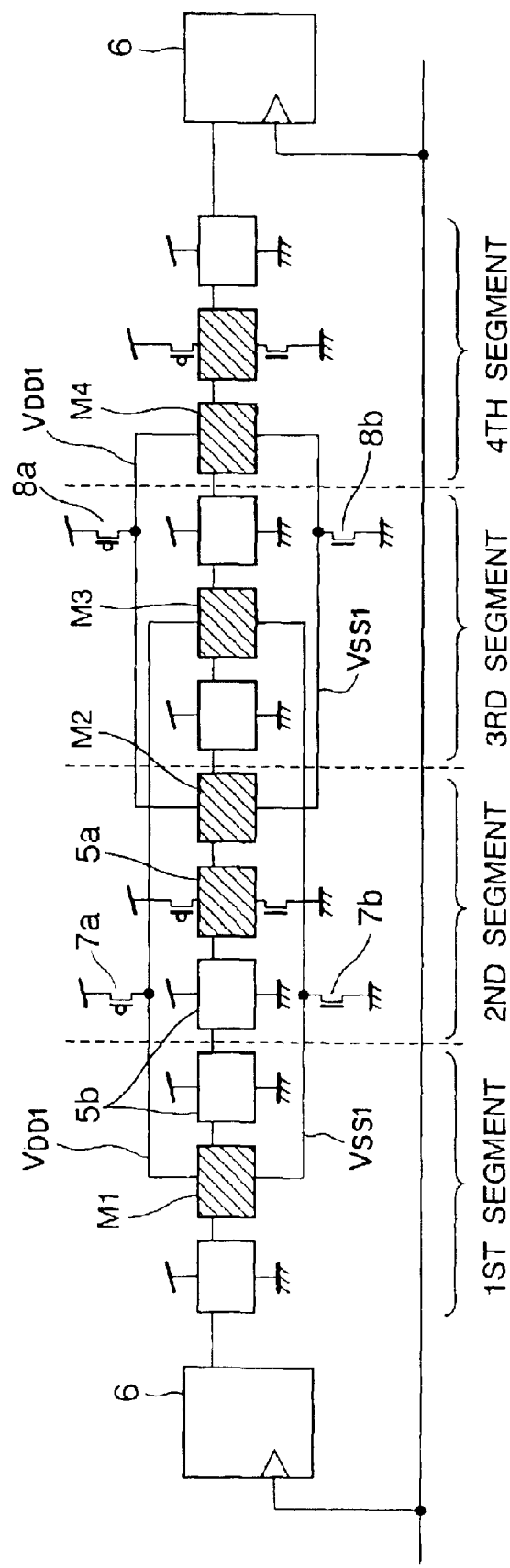
FIG. 3 is a circuit diagram showing the first embodiment of the semiconductor integrated circuit according to the present invention.

The circuit shown in FIG. 3 is an exemplary circuit in which the MT gate cells and standard cells randomly arranged along the critical path in the gate circuitry 1.

In this case, a plurality of gate cells (single logic circuits) are connected in series between flip-flops 6. Hatched ones of the gate cells (single logic circuits), 5a, represent gate cells (single logic circuits) having low threshold voltage transistors connected with the virtual power supply line VDD1 and the virtual ground line VSS1 while the remaining ones of the gate cells, 5b, are comprised of high threshold voltage transistors.

Two of those cells which have low threshold voltage transistors, M1 and M3, include shared high threshold voltage transistors (switches) 7a and 7b interposed between the virtual power supply line VDD1 and the power supply line VDD and between the virtual ground lines VSS1 and the ground line VSS, respectively. Another pair of the cells which have low threshold voltage transistors, M2 and M4, are similarly connected to both the virtual power supply line VDD1 and the virtual ground line VSS1 which are connected to the power supply line VDD and the ground line VSS, respectively, with interposing high threshold voltage transistors (switches) 8a and 8b shared between the cells. The cell M1 combined with the cell M3 and the cell M2 combined with the cell M4 are cell pairs that show transition of output voltage "at different timing" from each other. Such transition "at different timing" means a relative state of the cell pairs of which output voltage transition would not occur simultaneously or at approximate timing.

Figure 4:
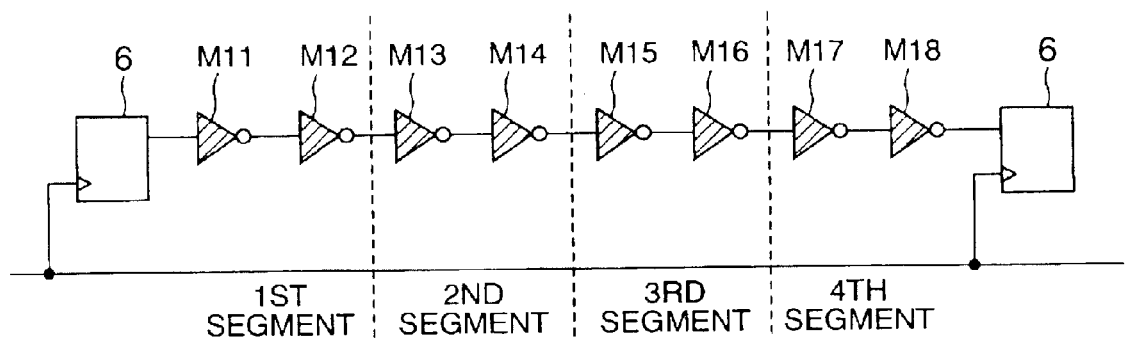
FIG. 4 depicts an exemplary circuit of the first embodiment of the semiconductor integrated circuit according to the present invention.
Figures 5A, 5B, 5C, 5D, 5E, 5F, 5G, 5H:
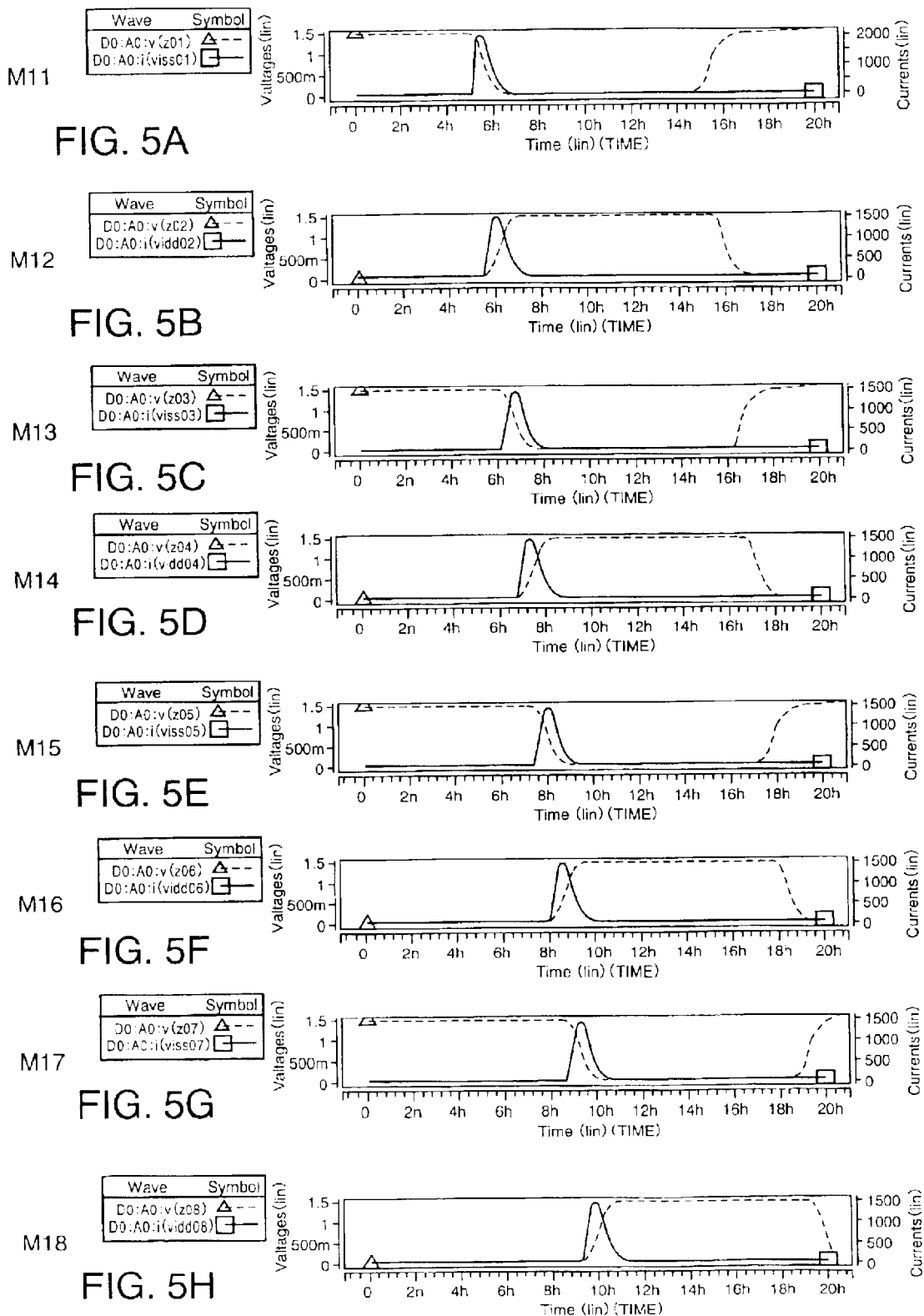
FIGS. 5A to 5H are diagrams showing a time-varying voltage or current at the circuit in FIG. 4.

FIG. 4 depicts an example of the circuitry in FIG. 3, having inverters connected in series.

FIGS. 5A to 5H are time-varying levels of output voltage or pass-through current from the power supply to the ground in the circuitry in FIG. 4. During transition of the output voltage or while the pass-through current occurs, the cell is in a transition state, varying from one phase to another, but at constant output voltage or with almost zero pass-through current, the cell is in a stationary state.

Referring to the drawings in an alphabetical order from FIG. 5A to FIG. 5H, it is obvious that the transition of the output voltage or the occurrence of the pass-through current successively propagates from the leftmost cell M11 toward the rightmost cell M18. In other words, the transition state starting from the leftmost cell M11 is serially followed toward the rightmost cell M18.

During the transition of the output voltage in the cell M11, the cell M12 is also turned to a transition state at tight timing, and this situation is expressed like "the cell M11 and the cell M12 are in a transition state simultaneous with each other." During the transition of the output voltage in the cell M11, the cell M 13 is not in a transition state, but almost simultaneous with cell's (M11) turning from its transition state to a stationary state, the cell M13 turns to a transition state. This relation of the cell M11 with the cell M13 can be expressed like "they are in a transition state, respectively, at close timing."

In this embodiment, the cells "in a transition state at different timing" as mentioned above must have shared switches. As can be perceived in a relation of the cell M11 with the cell M15, the cell M15 is always in a stationary state during the transition of the output voltage in the cell M11, and reversely, the cell M11 is in a stationary state during the transition of the output voltage in the cell M15.

An analyzation of the timing as in the above will be helpful in distinguishing the first segment of the cells M11 and M12, the second segment of the cells M13 and M14, the third segment of the cells M15 and M16, and the fourth segment of the cells M17 and M18, from one another. The cells in the first and third segments, and the cells in the second and fourth segments can respectively share the high threshold voltage transistors (switches) with each other. It is also certain that the cells in the first and fourth segments can share the high threshold voltage transistors (switches) with each other.

When two of the cells that develop transition of the output voltage simultaneously or at approximate timing are supplied with power through the single shared transistor, a potential at the virtual power supply line VDD1 for the cells varies due to the transition of the output voltage in both the cells and would never be fixed depending upon a single factor or component. On the contrary, as for two of the cells that develop transition of the output voltage at different timing, the transition of the output voltage in one cell means a stationary state of the other without exception. Thus, in the latter case, it is ensured that only one cell is supplied with power, and the potential at the virtual power supply lien VDD1 for the cells is fixed depending upon the single factor or component.

As has been recognized, for two of the MT gate cells, the single pair of the high threshold voltage transistors can serve as shared switches for power supply, and this brings about a reduction of the number of devices, which in turn leads to a decrease in a required chip area. The cells sharing the same switches are not limited to two in number but may be three or more.

Embodiment 2

Figure 6:
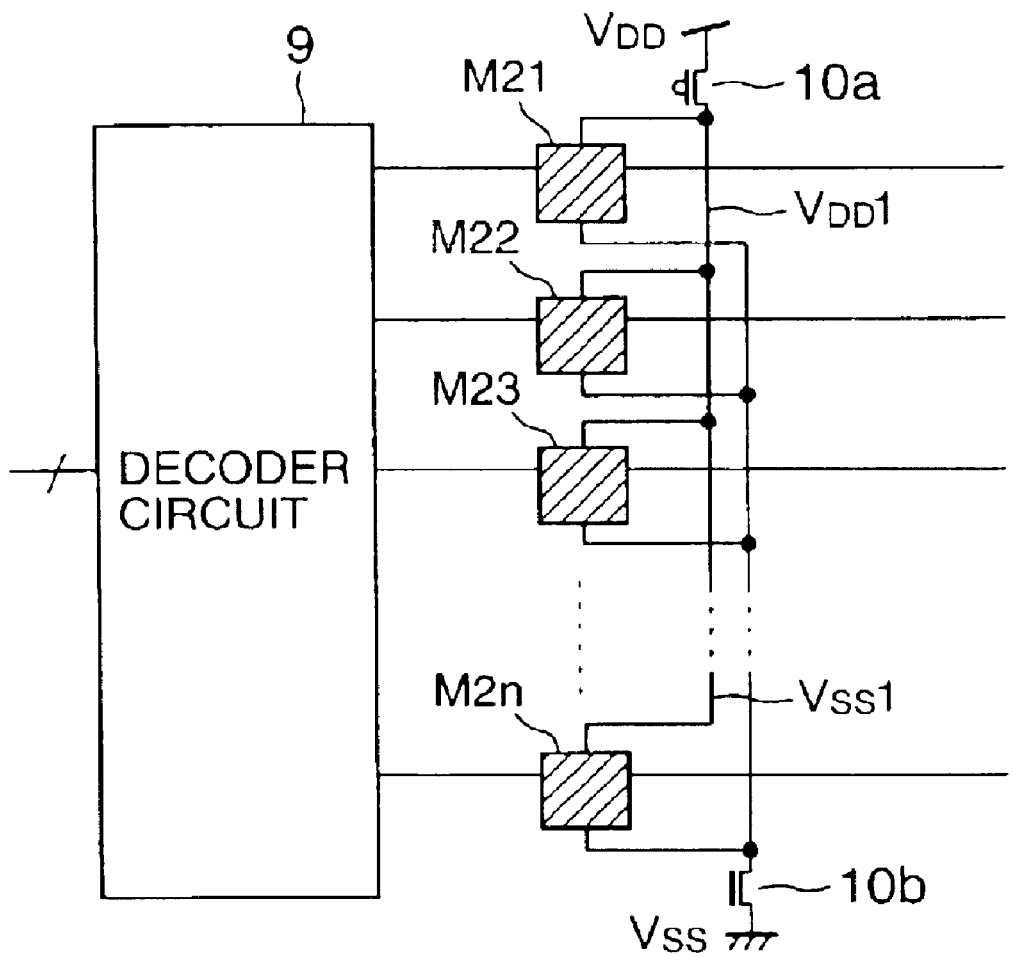
FIG. 6 is a circuit diagram showing a second embodiment of the semiconductor integrated circuit according to the present invention.

A second embodiment of the present invention will be described in detail in conjunction with FIG. 6. A decoder circuit 9 has its output terminals to which cells (single logic circuits) M21 to M2n are respectively connected. All the gate cells M21 to M2n are respectively comprised low threshold voltage transistors that are connected to a virtual power supply line VDD1 and a virtual ground line VSS1. The virtual power supply lines VDD1 connected to the gate cells (single logic circuits) M21 to M2n are commonly connected to a drain terminal of a high threshold voltage transistor 10a serving as a switch. The source of the transistor 10a is connected to power supply line VDD. The virtual power ground lines VSS1 connected to the gate cells (single logic circuits) M21 to M2n are commonly connected to a source terminal of a high threshold voltage transistor 10b serving as a switch. The drain of the transistor 10b is connected to ground power supply line VSS.

Another high threshold voltage transistor 10b serving as a switch has its source connected to the gate cells M21 to M2n in common through the virtual ground line VSS1, and has its drain grounded.

The operation of this embodiment will now be explained.

Merely the gate cell (single logic circuits) that receives an output signal from the decoder circuit 9 will be turned to a transition state while the remaining gate cells that do not receive the output signal maintain their stationary state. Thus, power is supplied to the virtual power supply line VDD1 from the power supply line VDD and to the virtual ground line VSS1 from the ground line VSS while the remaining gate cells would not supplied with power from the power line VDD and the ground line VSS. Thus, the plurality of the gate cells M21 to M2n can share the single pair of the switches, and this leads to a reduction of a chip area.

Figure 7:
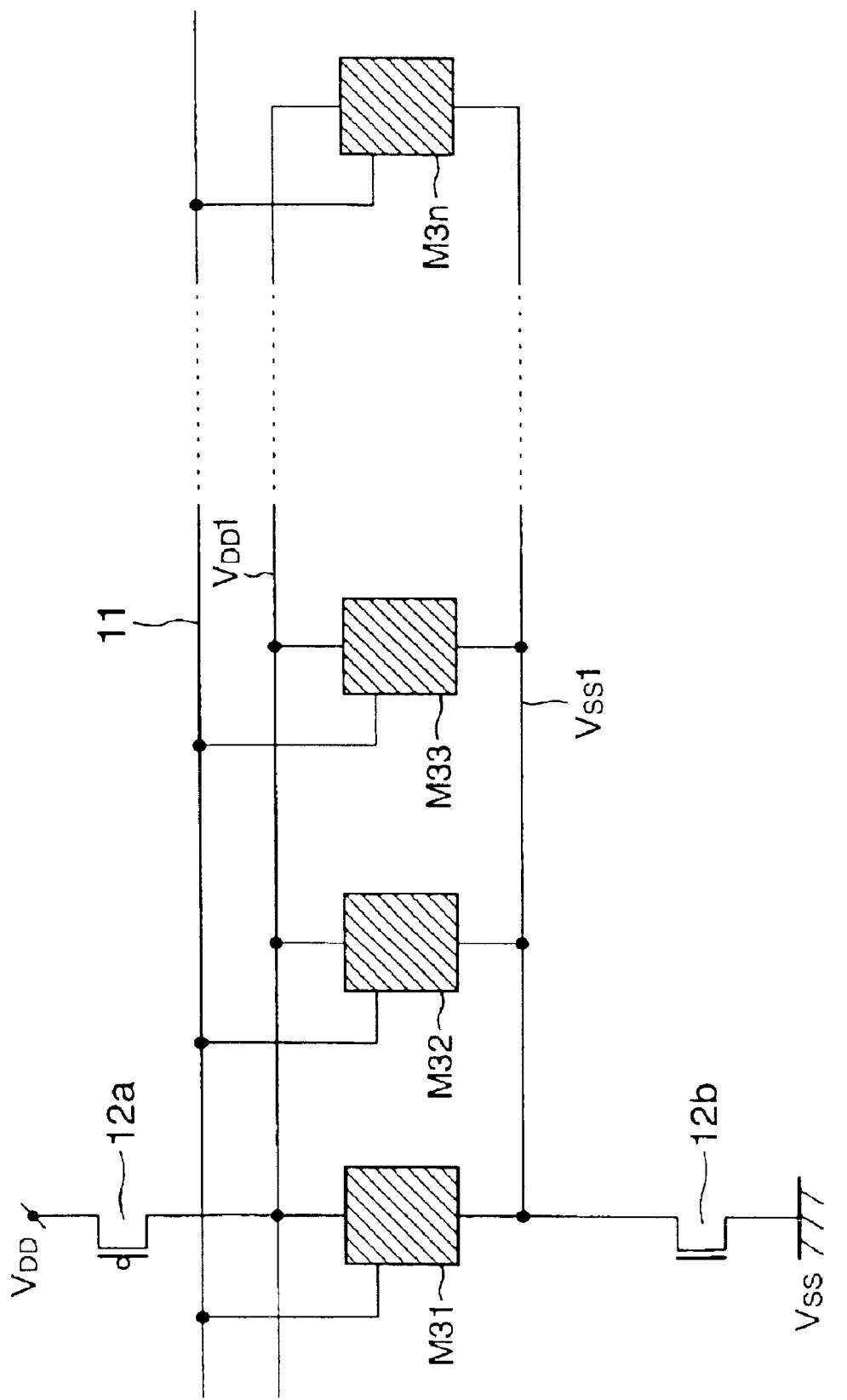
FIG. 7 is a circuit diagram showing the second embodiment of the semiconductor integrated circuit according to the present invention.

This embodiment can be applied to circuitry as shown in FIG. 7, which has a bus line 11 and a plurality of bus drivers (single logic circuits) M31 to M3n connected to the bus line 11. These bus drivers M31 to M3n are respectively comprised of low threshold voltage transistors connected to a virtual power supply line VDD1 and a virtual ground line VSS1, respectively. A high threshold voltage transistor 12a serving as a switch has its drain connected to the bus drivers (single logic circuits) M31 to M3n in common through the virtual power supply line VDD1, and has its source connected to a power supply line VDD. Another high threshold voltage transistor 12b serving as a switch has its drain connected to the bus drivers M31 to M3n in common through the virtual ground line VSS1, and has its source grounded.

Among the bus drivers M31 to M3n connected on the single bus line 11, only selected one of them is turned to a transition state while the remaining bus drivers maintain themselves in a stationary state, so that signals to and from the bus drivers M31 to M3n can be prevented from colliding on the bus line 11.

Each of the bus drivers (single logic circuits) M31 to M3n has low threshold voltage transistors connected to the virtual power supply line VDD1 and the virtual ground line VSS1. A high threshold voltage transistor 12a serving as a switch has its drain connected to the bus drivers M31 to M3n in common through the virtual power supply line VDD1, and its source connected to the power supply line VDD. Another high threshold voltage transistor 12b serving as a switch has its source connected to the bus drivers M31 to M3n in common through the virtual ground line VSS1, and has its drain grounded.

Only selected one of the bus drivers (single logic circuits) M31 to M3n is supplied with power through the virtual power supply line VDD1 and the virtual ground line VSS1 from the power supply line VDD and the ground line VSS while the remaining bus drivers would not be supplied with power from the power supply line VDD and the ground line VSS. As has been described, in the circuitry of the bus line 11 and the bus drivers M31 to M3n in FIG. 7, the plurality of the bas drivers M31 to M3n can share the single pair of the switches 12a and 12b, and this brings about a reduction of a chip area.

Embodiment 3

A third embodiment of the present invention will be described in conjunction with FIG. 8. Circuitry in FIG. 8 has two flip-flops 16 on a critical path and a plurality of gate cells (single logic circuits) 13 connected in series between them. The hatched gate cells are single stage gate inverting logic circuits that have low threshold voltage transistors connected to a virtual power supply line VDD1 and a virtual ground line VSS1. Gate cells 14 and 15, which are the single stage gate inverting logic circuits juxtaposed with each other, can share a pair of high threshold voltage transistors (switches) interposed between the virtual power supply line VDD1 and a power supply line VDD and between the virtual ground line VSS1 and a ground line VSS, respectively.

Figure 8:
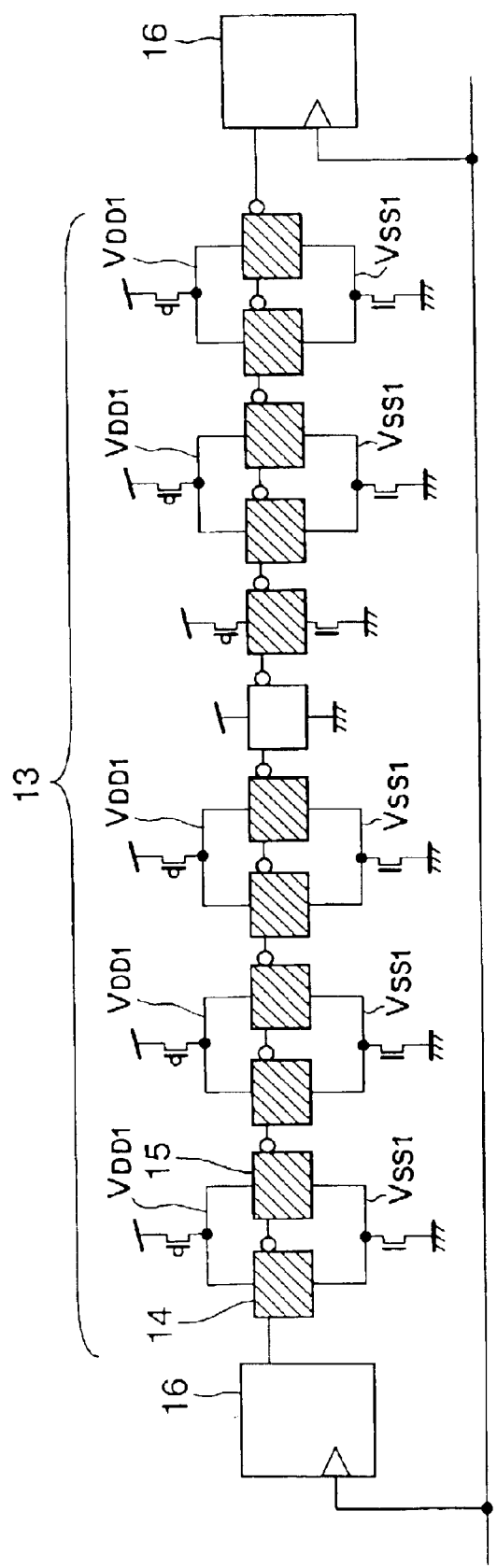
FIG. 8 is a circuit diagram showing a third embodiment of the semiconductor integrated circuit according to the present invention.
Figure 9:
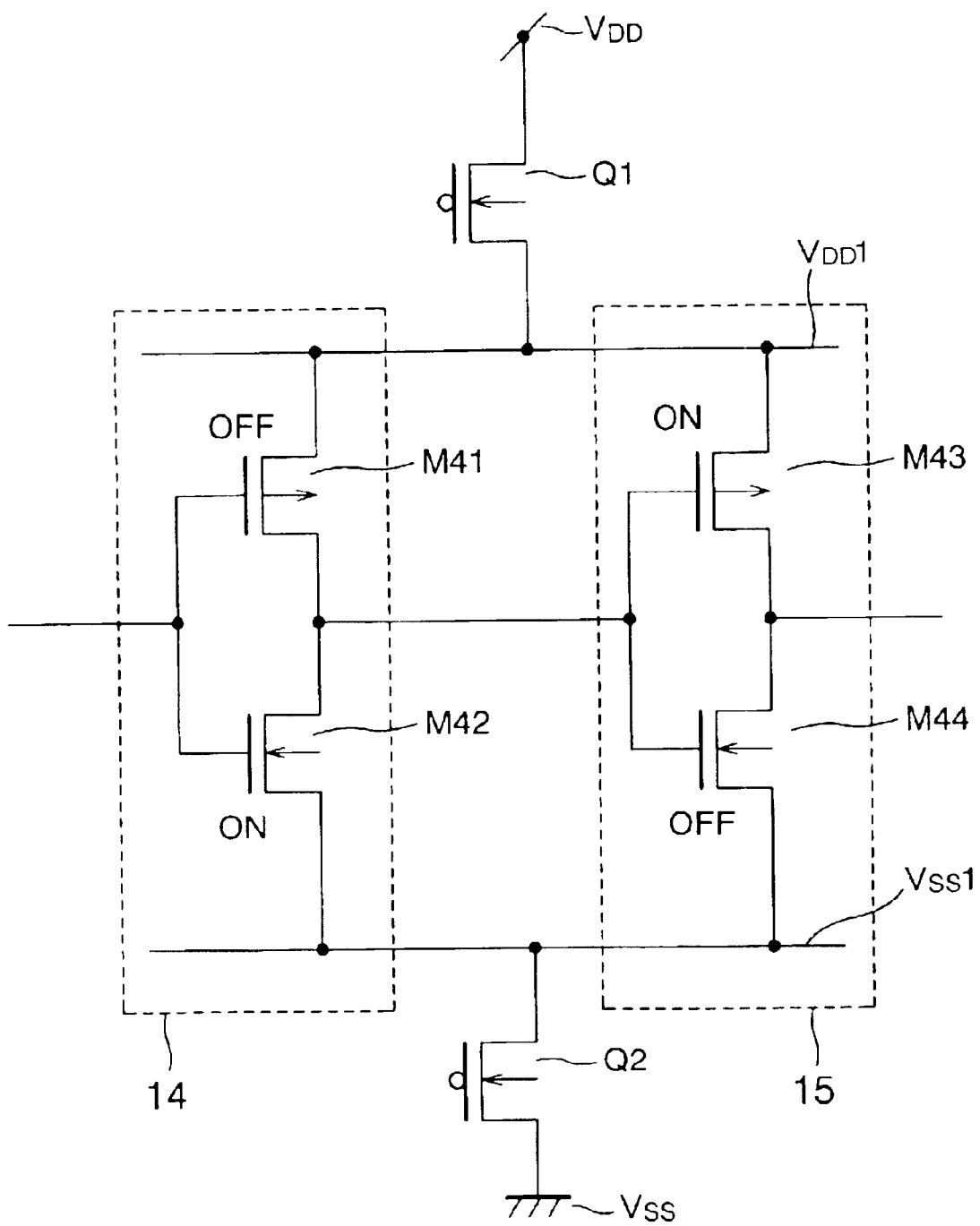
FIG. 9 is an exemplary MT gate cell for gate circuitry in FIG. 8.
Figure 10:
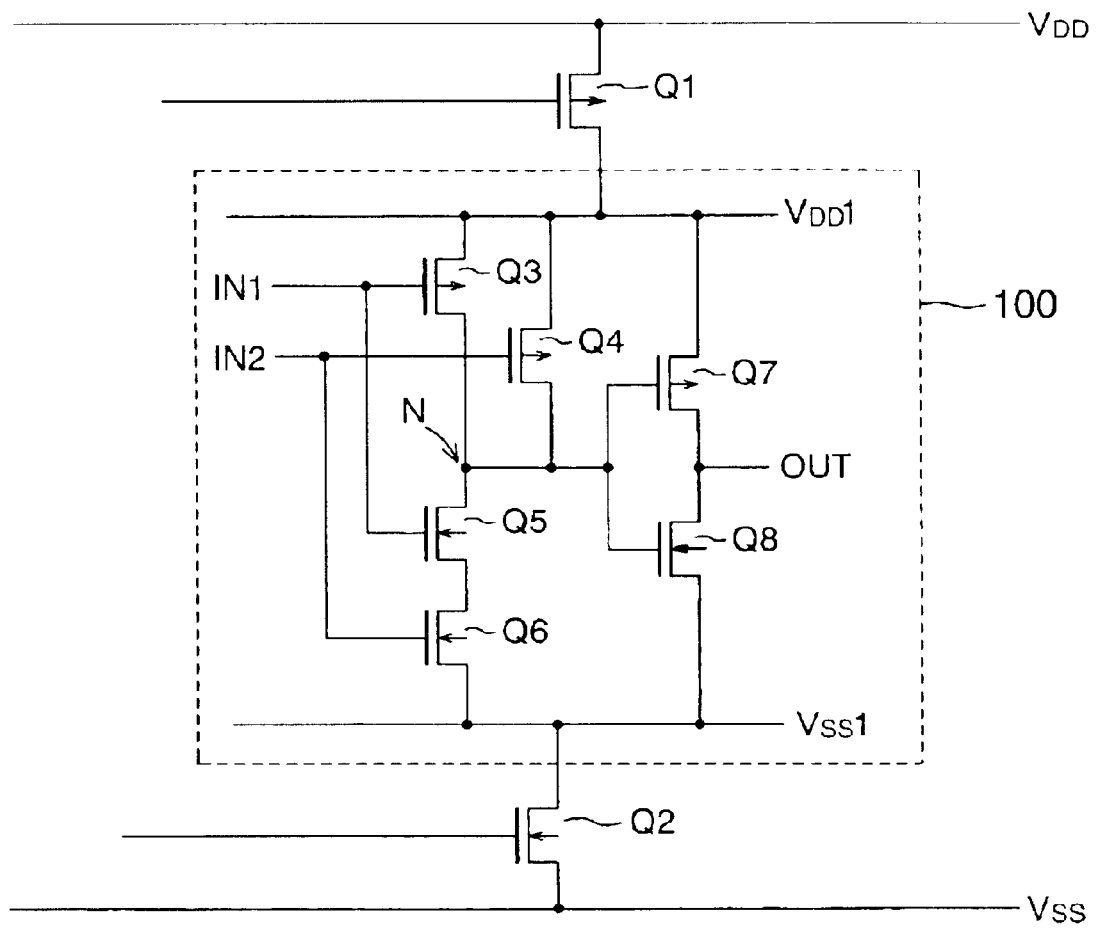
FIG. 10 is a circuit diagram showing a prior art MT-CMOS.

FIG. 9 is an embodied circuit diagram of one application where the juxtaposed gate cells (single stage gate inverting circuits) 14 and 15 in FIG. 8 function to be inverter circuits. The gate cell 14, when receiving a high-level voltage at an input terminal, has its PMOS transistor M41 turned off and its NMOS transistor M42 turned on, respectively. Thus, the gate cell 14 produces a low-level voltage from an output terminal while the gate cell 15 receives the low-level voltage at an input terminal. The gate cell 15 has its PMOS transistor M43 turned on and its NMOS transistor M44 turned off.

Thus, the PMOS transistors M41 and M43 of the gate cells (single stage gate inverting logic circuits) 14 and 15 would never turn on simultaneous with each other or at approximate timing, and neither would do the NMOS transistors M42 and M44 of the gate cells 14 and 15. In this way, potential variations at nodes with the switches can be determined uniquely, it is certain that the gate cells can share the switches. This brings about a reduction of the number of the high threshold voltage transistors serving as the switches, and eventually, a chip area can be reduced.

Although, in the above-mentioned embodiments, the cells on the single critical path are addressed, the present invention can be effected in an application where the cells on the different critical paths share the switches.

As has been described, in accordance with the embodiments of the present invention, a design of the shared switches of the plurality of the MT gate cells contributes to an implementation of a semiconductor integrated circuit where, without an increase in a chip area, accelerated operation and reduced leak current can be accomplished.

What is claimed is:

1. A semiconductor integrated circuit, comprising:
   a first reference voltage line;
   a second reference voltage line;
   a plurality of single logic circuits each including a plurality of transistors;
   a first switch having a first transistor provided between said first reference voltage line and said logic circuits, said first transistor having a higher threshold voltage than that of transistors in the logic circuits; and
   a second switch having a second transistor provided between said second reference voltage line and said logic circuits, said second transistor having a higher threshold voltage than that of transistors in the logic circuits,
   said first and second switches being turned on when at least one of said single logic circuits is in operation, while said first and second switches being turned off when all of said single logic circuits are in standby state.

2. The semiconductor integrated circuit according to claim 1, wherein said first reference line is a power supply line and said second reference line is a ground line.

3. The semiconductor integrated circuit according to claim 1, wherein said single logic circuits have a first virtual power supply line and a second virtual power supply line, said first virtual power supply line and said second virtual power supply line being shared among the plurality of single logic circuits.

4. The semiconductor integrated circuit according to claim 1, wherein said at least one of said single logic circuits is in a transition state, no transition of the output voltage being developed in the remaining single logic circuits.

5. The semiconductor integrated circuit according to claim 1, wherein said single logic circuit has transistors of high threshold voltages along a critical pass.

6. A semiconductor integrated circuit, comprising:
   a first reference voltage line;
   a second reference voltage line;
   a plurality of single logic circuits each comprised of combined transistors having first and second virtual power supply lines;
   a first shared switch interposed between said first reference voltage line and said first virtual power supply line for the single logic circuits, the first shared switch being a transistor having higher threshold voltage than that of the transistors of said single logic circuits; and
   a second shared switch interposed between the second reference voltage line and the second virtual power supply line for the single logic circuits, the second shared switch being a transistor having higher threshold voltage than that of the transistors of said single logic circuits;
   said first and second shared switches being turned on when at least one of said single logic circuits is in operation, while said first and second shared switches being turned off when all of said single logic circuits are in standby state.

7. The semiconductor integrated circuit according to claim 6, wherein said first reference line is a power supply line and said second reference line is a ground line.

8. A semiconductor integrated circuit, comprising:

a first reference voltage line;

a second reference voltage line;

a plurality of single logic circuits each comprised of transistors having first and second virtual power supply lines;

a first shared switch interposed between said first reference voltage line and said first virtual power supply line for said single logic circuits, said first shared switch being a transistor higher in threshold voltage than the transistors of the single logic circuits; and a second shared switch interposed between the second reference voltage line and the second virtual power supply line for the single logic circuits, the second shared switch being a transistor higher in threshold voltage than the transistors of the single logic circuits, said at least one of the single logic circuits is in a transition state, no transition of output voltage being developed in the remaining single logic circuits.

9. The semiconductor integrated circuit according to claim 8, wherein said first reference line is a power supply line and said second reference line is a ground line.

10. The semiconductor integrated circuit according to claim 8, wherein said first shared switch is provided in odd-numbered segments, said second shared switch is provided in said odd-numbered segments, and said single logic circuits in even-numbered segments being capable of delaying transition of output voltage so that output voltages from the single logic circuits in the odd numbered segments would not simultaneously be in a sate of transition.

11. The semiconductor integrated circuit according to claim 8, further comprising a decoder circuit having a plurality of output terminals, wherein said first virtual power supply line for the single logic circuits connected to the output terminals of the decoder circuit, and said second virtual power supply line for the single logic circuits connected to the output terminals of the decoder circuit.

12. The semiconductor integrated circuit according to claim 8, further comprising a single bus line connected to output terminals of the single logic circuits.

13. A semiconductor integrated circuit, comprising:

a first reference voltage lines;

a second reference voltage lines;

a first single stage gate inverting logic circuit comprised of transistors in combination connected to first and second virtual power supply lines;

a second single stage gate inverting logic circuit juxtaposed with the first single stage gate inverting logic circuit and connected to third and fourth virtual power supply lines;

a first switch interposed between the first reference voltage line and the first and third virtual voltage lines, the first switch being a transistor higher in threshold voltage than the transistors of the first and second single stage gate inverting logic circuits;

a second switch interposed between the second reference voltage line and the second and fourth virtual voltage lines, the second switch being a transistor higher in threshold voltage than the transistors of the first and second single stage gate inverting logic circuits.

14. The semiconductor integrated circuit according to claim 11, wherein said first reference line is a power supply line and said second reference line is a ground line.

* * * * *